(12) United States Patent
Stuck et al.

(10) Patent No.: US 8,259,201 B2
(45) Date of Patent: Sep. 4, 2012

(54) COLOR IMAGE SENSOR

(75) Inventors: Alexander Stuck, Wettingen (CH);
Marc Schnieper, Onex (CH)

(73) Assignee: CSEM Centre Suisse d'Electronique et de Microtechnique SA, Neuchatel (CH)

( * ) Notice: Subject to any disclaimer, the term of this patent is extended or adjusted under 35 U.S.C. 154(b) by 1346 days.

(21) Appl. No.: 11/477,006

(22) Filed: Jun. 28, 2006

(65) Prior Publication Data

US 2007/0002414 A1    Jan. 4, 2007

(30) Foreign Application Priority Data

Jun. 30, 2005    (EP) .................... 05014149

(51) Int. Cl.
*H04N 9/083* (2006.01)
*G02B 5/18* (2006.01)
*G02B 5/20* (2006.01)

(52) U.S. Cl. ...... 348/273; 348/272; 250/226; 250/208.1; 250/216; 359/558; 359/566; 359/568; 358/909.1

(58) Field of Classification Search .................... 358/1.9, 358/474, 482, 483, 515, 512–514, 909.1; 359/15, 558, 566, 568, 572, 491.01; 348/273, 348/272; 250/226, 208.1, 216
See application file for complete search history.

(56) References Cited

U.S. PATENT DOCUMENTS

| | | | |
|---|---|---|---|
| 4,251,137 A | 2/1981 | Knop et al. | |
| 4,255,019 A * | 3/1981 | Knop | 359/569 |
| 4,484,797 A * | 11/1984 | Knop et al. | 359/568 |
| 5,872,654 A * | 2/1999 | Shirochi | 359/566 |
| 6,045,894 A * | 4/2000 | Jonza et al. | 428/212 |
| 6,765,617 B1 | 7/2004 | Tangen et al. | |
| 8,035,069 B2 * | 10/2011 | Toda et al. | 250/208.1 |
| 8,179,457 B2 * | 5/2012 | Koskinen et al. | 348/273 |
| 8,198,578 B2 * | 6/2012 | Koskinen et al. | 250/226 |
| 2004/0095531 A1 | 5/2004 | Jiang et al. | |
| 2004/0207386 A1 * | 10/2004 | Durr | 324/121 R |

FOREIGN PATENT DOCUMENTS

| | | |
|---|---|---|
| EP | 0 507 487 A2 | 10/1992 |
| EP | 1 341 235 | 9/2003 |
| EP | 1 739 751 A1 | 1/2007 |

* cited by examiner

*Primary Examiner* — Cheukfan Lee
(74) *Attorney, Agent, or Firm* — Weingarten, Schurgin, Gagnebin & Lebovici LLP

(57) ABSTRACT

A color image sensor has a plurality of pixels. On the pixels zero-order diffractive color filters (DCFs) (1) are arranged. Different zero-order DCFs (1), e.g., DCFs (1) transmitting red, green and blue light, respectively, are allocated to the pixels of the color image sensor. The use of DCFs (1) for color imaging devices brings better defined band-pass or notch filters than the presently used lacquers. The DCFs (1) are more stable with respect to time, temperature and any environmental aggression. The manufacture of the DCF pattern is simpler and cheaper than that of a conventional dye-filter pattern, since the different types of DCFs can be manufactured simultaneously.

9 Claims, 4 Drawing Sheets

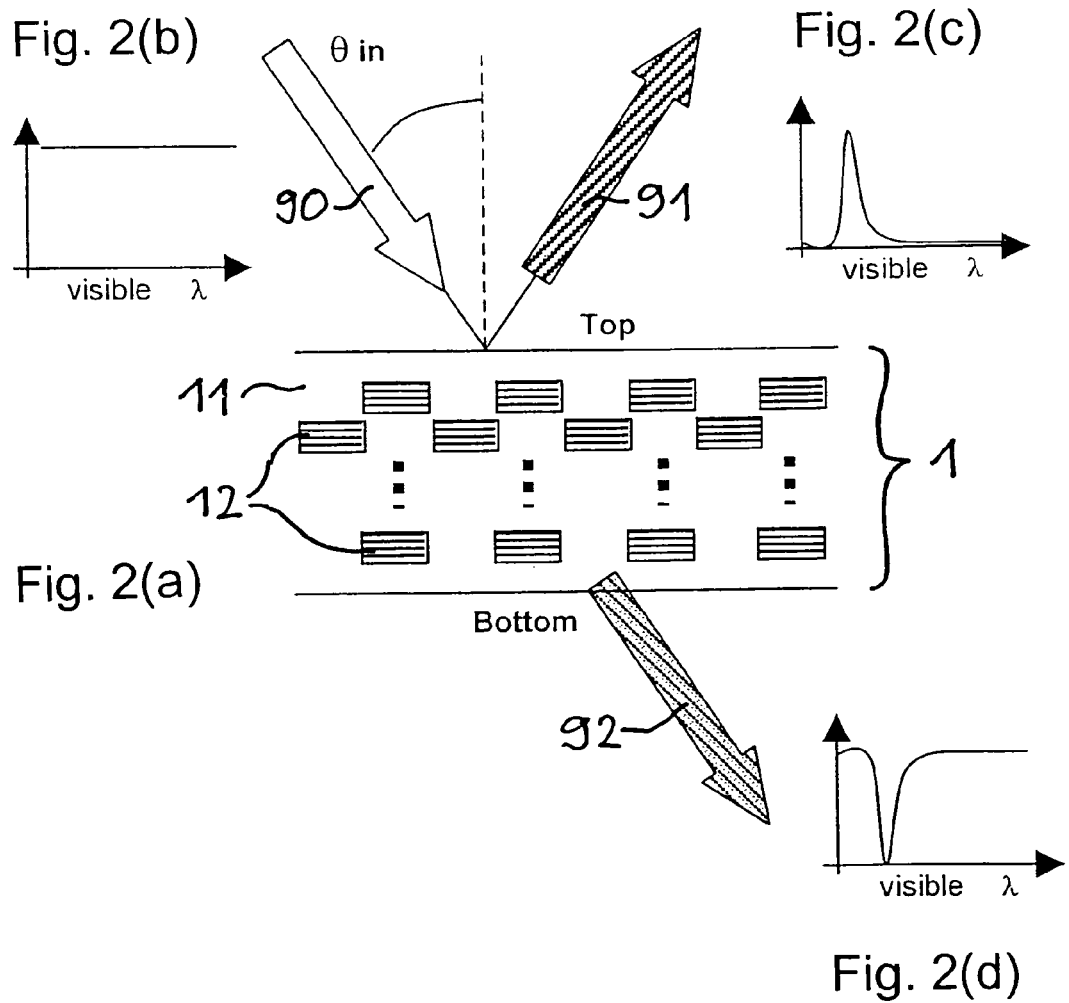

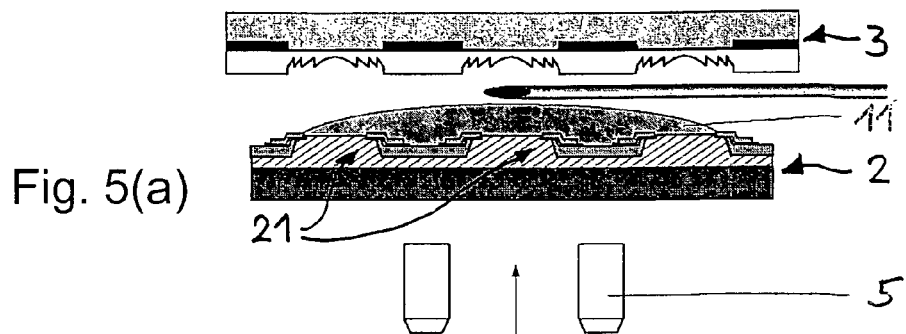
Fig. 5(a)
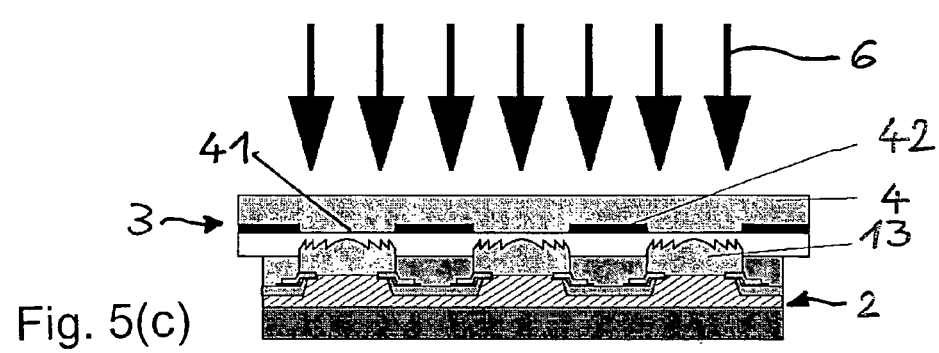
Fig. 5(b)
Fig. 5(c)
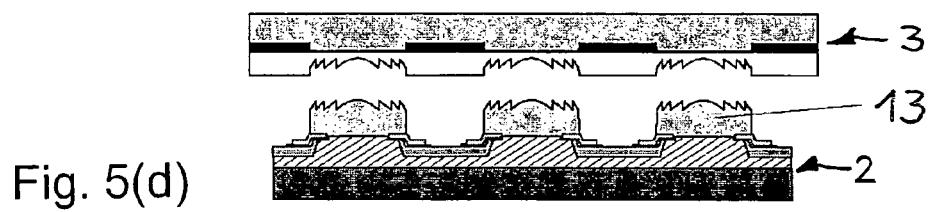
Fig. 5(d)
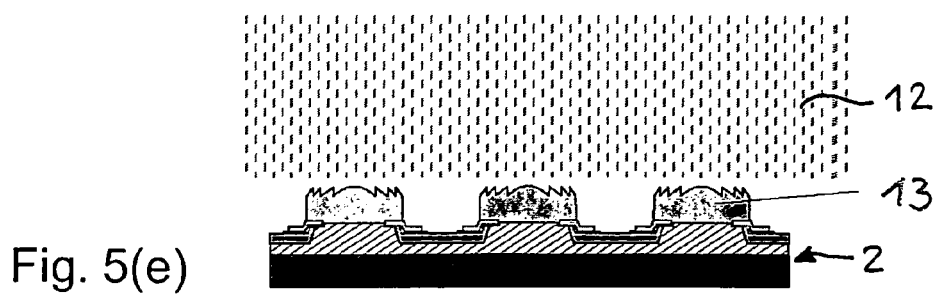
Fig. 5(e)

COLOR IMAGE SENSOR

This application claims priority to European application No. 05014149.8 filed Jun. 30, 2005.

FIELD OF THE INVENTION

The present invention is in the field of digital color imaging and relates to a color image sensor, a method for its manufacture and a method for color image sensing, according to the preambles of the independent claims.

BACKGROUND OF THE INVENTION

A digital, solid-state camera comprises imaging optics for imaging a scene onto an image sensor. The image sensor comprises a one- or two-dimensional array of picture elements (pixels) that transduce the incident light into electric signals; it is typically a solid-state device using the charge-coupled device (CCD) or the complementary-metal-oxide-semiconductor (CMOS) technology. The electric signals are read out and processed.

For capturing color images, each pixel of the image sensor has to selectively be sensitive only to certain light wavelengths. The wavelength (or color) selectivity is usually achieved by a color filter on top of each pixel. Filters for different colors are distributed in certain patterns on the pixel array. The most common pattern of filters is the Bayer filter pattern which alternates a row of red and green filters with a row of blue and green filters. Seldom, other patterns and/or colors are used.

The filters themselves are usually executed as absorption filters. Such an absorption filter is a layer of organic material comprising an organic dye that essentially transmits one color—e.g., red—and absorbs all other colors—e.g., green and blue. The main drawback of absorption filters is their limited lifetime. The organic materials degrade and age. The aging process is speeded up by external influences such as ultraviolet (UV) radiation, high temperature, humidity, etc. Consequently, the quality of a conventional digital camera decreases with time. Further disadvantages of image sensors with absorption filters are the complexity and the expensiveness of their manufacture. In order to manufacture the filters for one color, a corresponding layer is deposited on the chip, a mask defining the pixels for detecting the corresponding color has to be provided, the layer is exposed through the mask, and the superfluous areas of the layer are removed. This procedure has to be performed for each of the at least three colors—e.g., the primary colors red, green and blue. Moreover, the spectral characteristics of the absorption filters are often not precisely defined and difficult to adapt to a desired behavior.

Diffractive zero-order filters are known in optics, e.g., from U.S. Pat. No. 4,484,797. They consist of non-absorbing diffractive structures, i.e., phase objects, made of different material layers with different refractive indices. Their typical dimensions (grating periods) are equal to or smaller than the light wavelength. These diffractive filters are mainly used as optically variable security devices in banknotes, credit cards, passports etc. To date, diffractive optics has hardly been used in microelectronics. The technologies are believed to be incompatible, and the dimensions of the diffractive structures are often in the same range or larger than those of the microelectronic device and thus not applicable to it.

SUMMARY OF THE INVENTION

It is therefore an object of this invention to provide a color image sensor, a method for its manufacturing and a method for color image sensing that avoid the drawbacks of the prior art. In particular, the color image sensor shall be less sensitive to environmental influences. It shall be manufacturable in a simple, cheap process that is preferably compatible with standard semiconductor processes. Moreover, the manufacturing method shall provide a high number of degrees of freedom so that the spectral characteristics of the color filters can be tailored and adapted to fit given demands.

These and other problems are solved by the color image sensor, its manufacturing method and the method for color image sensing as defined in the independent claims. Advantageous embodiments of the invention are given in the dependent claims.

The basic idea of the invention is to utilize diffractive color filters (DCFs) for the selective spectral filtering of incident electromagnetic radiation. Different zero-order diffractive color filters, e.g., three types of such DCFs, are allocated to the pixels of the color image sensor.

The use of DCFs for color imaging devices brings better defined band-pass or notch filters than the presently used lacquers. The DCFs do not include any dyes or color absorbers; therefore they are more stable with respect to time, temperature and any environmental aggression. The manufacture of the DCF pattern is simpler and cheaper than that of a conventional dye-filter pattern, since the different types of DCFs can be manufactured simultaneously.

Thus, the color image sensor according to the invention has a plurality of pixels, at least part of the pixels comprising color filters. The color filters comprise zero-order diffractive color filters.

In the method for manufacturing the color image sensor according to the invention, an image sensor with a plurality of pixels is manufactured, and at least part of the pixels are provided with color filters. The color filters are realized as zero-order diffractive color filters.

The invention also encompasses the use of zero-order diffractive color filters for color image sensing.

The inventive method for color image sensing comprising the steps of providing a color image sensor with a plurality of pixels, impinging incident electromagnetic radiation onto the image sensor, and selectively spectrally filtering at least part of the incident electromagnetic radiation. The spectral filtering makes use of zero-order diffraction.

Throughout this document, terms such as "light", "optical" or "color" are not limited to visible light, but also refer to other parts of the electromagnetic spectrum close to the visible light, especially to near ultraviolet (NUV) or near infrared (NIR) radiation.

BRIEF DESCRIPTION OF THE DRAWINGS

Embodiments of the invention are described in greater detail hereinafter relative to the attached schematic drawings.

FIG. 1 shows two possible patterns of color filters for color image cameras.

FIG. 2 shows a cross-section through an embodiment of a color filter according to the invention, and spectra corresponding to three light beams involved.

FIG. 5 shows cross sections of photodetector according to the invention during various steps of the manufacturing method.

DESCRIPTION OF PREFERRED EMBODIMENTS

Figure 3A:
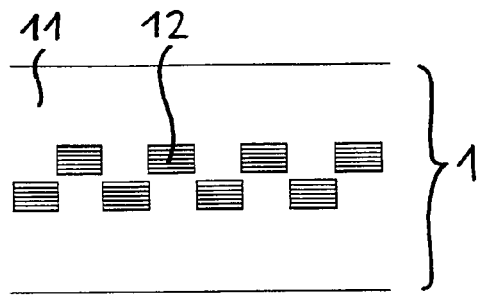
FIG. 3 shows cross-sections of three possible grating profiles of the color filter according to the invention.

To date, almost all color imaging cameras use different lacquers as color filters on their pixels. Three filters for different colors are commonly used in various patterns. Two examples of patterns for color image sensors are shown in FIG. 1. FIG. 1(a) shows an RGB Bayer pattern with the primary colors red R, green G and blue B. This pattern alternates a row of red and green filters with a row of blue and green filters. The distribution with more green filters than red and blue filters better imitates the sensitivity of the human eye. Instead of adding the different values of red, green and blue, it is possible to subtract values of the typesetting colors cyan C, magenta M and yellow Y. An example of a CMY filter is shown in FIG. 1(b).

According to the invention, the color selectivity of the pixels is achieved by means of diffractive color filters (DCF) on top of the pixels. A DCF comprises diffractive gratings and/or structures with different material layers of different refractive indices. These structures act like color filters with respect to reflection and/or transmission. A schematic example of a DCF 1 is shown in the cross section of FIG. 2(a). The DCF 1 is a two- or three-dimensional structure made of at least two essentially transparent materials 11, 12 with different refractive indices. The refractive index $n_{low}$ of a first one 11 of the at least two materials is lower than the refractive index $n_{high}$ of a second one 12 of the at least two materials. The layers of the DCF 1 may comprise a material or a combination of materials such as epoxy, acrylate, polycarbonate, UV-curable sol-gel material, silicon oxide, carbide, diamond, carbon, carbon derivative, ZnO, ZnS, and/or titanium oxide. The layers of the DCF 1 may also comprise inorganic materials filled with inorganic nanoparticles.

Low-index materials 11 may be, e.g., a polymer ($n_{low}$=1.34–1.65), $SiO_2$ ($n_{low}$≈1.46) or $MgF_2$ ($n_{low}$≈1.39); the indices of refraction are data for a wavelength of 550 nm. The low-index material 11 may also be a porous aerogel ($n_{low}$ close to 1.0). The index of refraction of sol-gel processed silica aerogel as described by Tsutsui et. al. ("Doubling Coupling-Out Efficiency in Organic Light-Emitting Devices Using a Thin Silica Aerogel Layer", Adv. Mater. 13, 2001, p. 1149-1152) is between 1.01 and 1.10. The low-index material 11 forms a layer on top of a pixel of the solid-state image sensor.

In the low-index layer 11, a structure of high-index material 12 is embedded, that acts as subwavelength waveguide. The high-index material 12 may be, e.g., ZnS ($n_{high}$≈2.38), $TiO_2$ ($n_{high}$≈2.1–2.5), $Ta_2O_5$ ($n_{high}$≈2.1–2.3) or $Si_3N_4$ ($n_{high}$≈2.03). The high-index structure is inhomogeneous in at least one direction of a plane defined by the pixel surface. In the example of FIG. 2, the high-index structure comprises a ruled grating. The ruled grating is essentially a two-dimensional structure. A plurality of such gratings can be arranged one above the other within the low-index layer 11, thus making a three-dimensional DCF. If the low-index material 11 has an index of refraction well below 1.5, the high-index material 12 can even be a layer with index of refraction of about 1.5, e.g. a polymer layer. The important parameter is the refractive-index difference between the high index $n_{high}$ and the low index $n_{low}$. A wet-process-able class of high-index materials 12 are nano-sized particles of a high-index material embedded in a polymeric matrix. An example are mixtures of PbS nano-particle and gelatine that have indices of refraction of up to 2.5 (Zimmermann et. al. J. Mater. Res., Vol. 8, No. 7, 1993, 1742-1748). Mixtures containing $Al_2O_3$, $ZrO_2$ or $TiO_2$ particles are also possible.

When light 90 impinges onto the DCF 1 with a certain angle of incidence $\theta_{in}$, a first portion 91 of the light 90 is reflected and a second portion 92 is transmitted through the DCF 1. Since the DCF 1 is a zero-order filter, the direction of propagation of the second, transmitted portion 92 is the same as that of the incident light 90. FIGS. 2(b)-(d) schematically show intensity spectra, i.e., intensity versus wavelength, of the incident light 90 and the two portions 91, 92, respectively. It is assumed that the incident light 90 is white, i.e., all visible wavelengths are present with equal intensities (FIG. 2(b)). The DCF 1 of this example reflects blue light, i.e., the spectrum of the first light portion 91 (FIG. 2(c)) has a peak around the wavelength λ≈460 nm. The spectrum of the second light portion 92 (FIG. 2(d)) is complementary to that of the first light portion 91 and shows a notch around the wavelength λ≈460 nm. The transmitted light 92 is thus yellow, the complementary color of blue. In other words: the DCF 1 of FIG. 2 is a blue band-pass filter in reflection and a yellow notch filter in transmission.

Figure 3B:
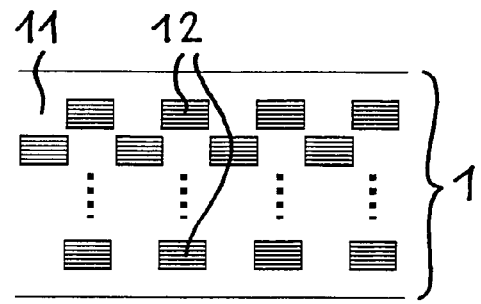
Figure 3C:
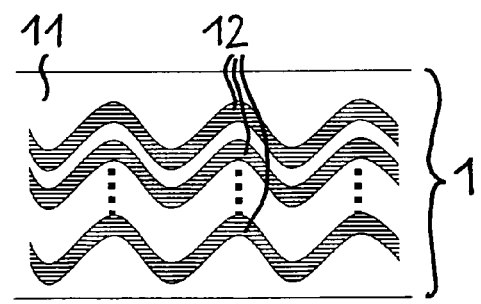

The diffractive structure profile can by made of gratings with various types of profiles. FIG. 3 shows some examples of many possible grating profiles. The profile of FIG. 3(a) is a simple square profile. The multiple square profile of FIG. 3(b) is formed by arranging a plurality of profiles such as shown in FIG. 3(a) one above the other. FIG. 3(c) shows a multiple sinus profile, and FIG. 3(d) a multiple triangular or sawtooth profile. The profile shapes have no restrictions about the symmetry, i.e., the profile shape need not be symmetric: the triangular profile can be blazed, or one side can be longer Further optical elements can be arranged beneath and/or above the DCF structure according to the invention. Such further optical elements may comprise as a thin layer or a stack of thin dielectric layers acting as a dielectric filter, metal layers, absorbing layers, diffractive elements, etc. They further may comprise a high-index layer acting as a waveguide, with a thickness between 10 nm and 1000 nm, and preferably between 50 nm and 500 nm, and with a refractive index that is at least by 0.2 higher than the refractive index of the surrounding material. Other appropriate means such as specialized camera optics, microlenses or additional grating structures may also be arranged on top of the DCF.

An appropriate choice of the DCF parameters will define the filter properties of the corresponding color band pass filter or notch filter. An important variable parameter, which essentially influences the spectral characteristics of the DCF, is the grating period. Other variable parameters are the grating depth, the grating profile, the height of the high-index layer, the refractive indices, the number of high-index/low-index transitions and/or the spacing between the high-index layers.

The DCFs according to the invention have periods that are approximately equal to or smaller than the wavelength of the light to be detected by the pixel. Typical grating periods are between 50 nm and 1000 nm, and preferably between 100 nm and 800 nm. The grating depth (of one layer) is between a few nanometers to a few micrometers, e.g., between 10 nm and 1000 nm, and preferably between 50 nm and 300 nm. The difference $n_2-n_1$ of the refractive indices of the high-index material (waveguide material) 12 and the low-index material 11 should, but must not necessarily, be high, e.g., higher than 0.2 and preferably higher than 0.4. The number of layers has no upper limit. Distances between two high-index layers of less than a few (approximately 2 or 3) micrometers will produce a coupling effect between the different DCF layers; more than a few micrometers will decouple them. Both effects can be used for the DCFs.

Examples of calculated transmission spectra for three different DCFs are shown in FIG. 4. The three filters were designed to transmit the typesetting colors cyan, magenta and yellow. The calculations were performed for one square-shaped grating structure with one layer of high-index material (waveguide material) 12. The parameters used in the calculation and some resulting characteristics are listed in Table I. Already with this simple model, very effective DCFs with the desired transmission characteristics were obtained. By entering further DCF parameters into the calculation, e.g., multiple high-index layers, the design can even more specifically fit a given need.

TABLE I

Figure 4A:
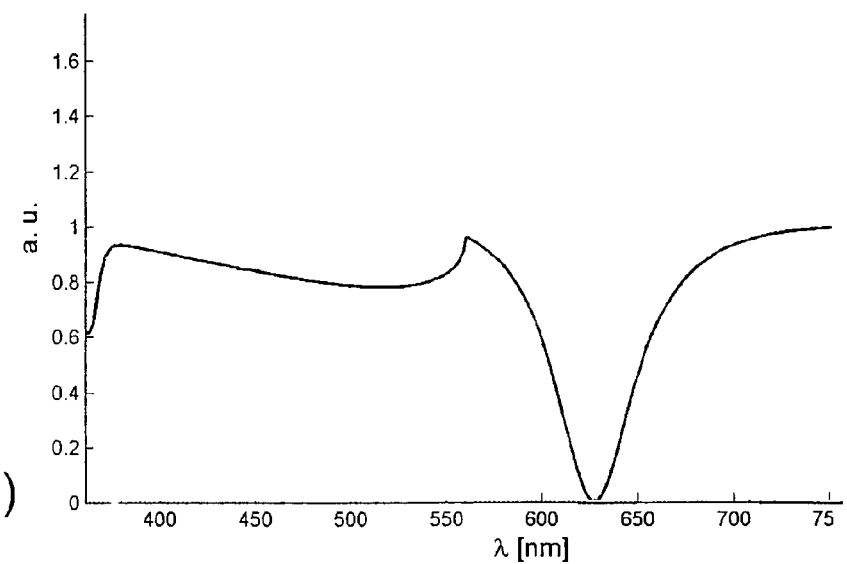
FIG. 4 shows an example of reflection spectra of three color filters according to the invention.
Figure 4B:
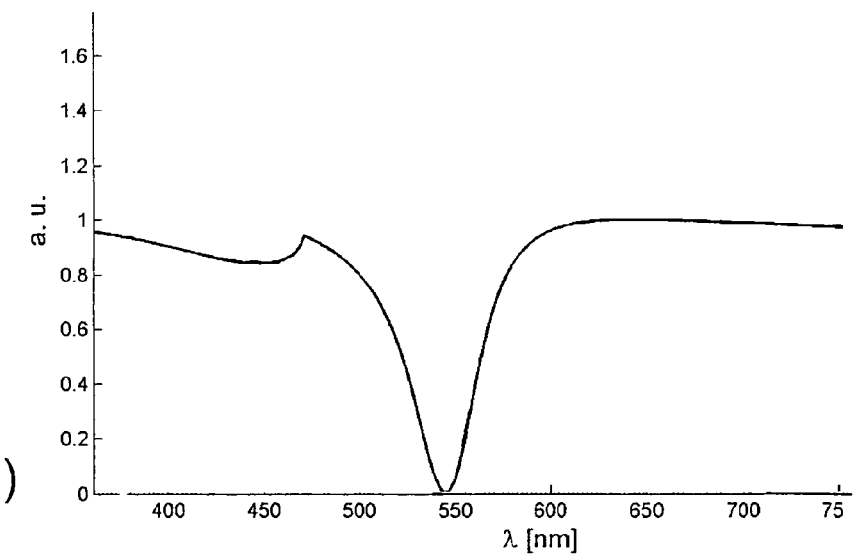
Figure 4C:
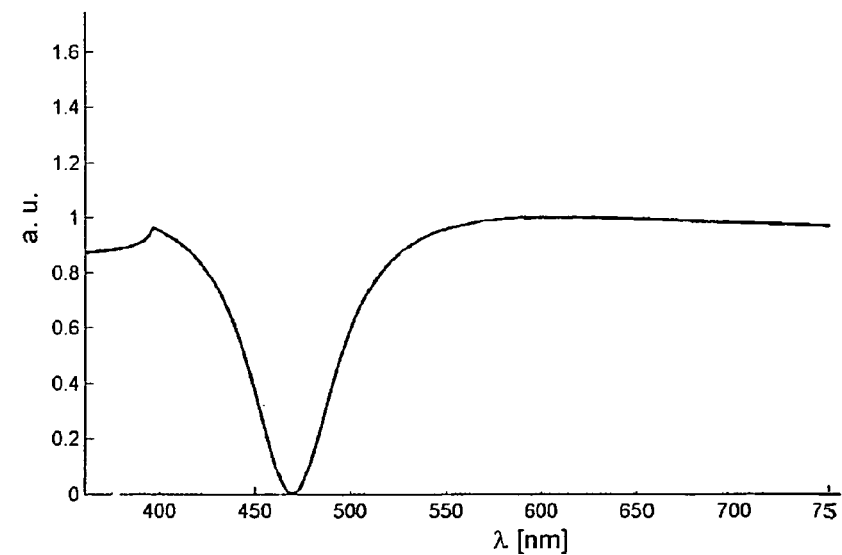

|  | FIG. 4(a) | FIG. 4(b) | FIG. 4(c) |
|---|---|---|---|
| Grating period | 360 nm | 300 nm | 250 nm |
| Grating depth | 100 nm | 70 nm | 70 nm |
| Grating profile | square | square | square |
| Height of the high-index layer | 70 nm | 70 nm | 70 nm |
| Refractive-index difference | 0.8 | 0.8 | 0.8 |
| Number of high-index layers | 1 | 1 | 1 |
| Transmitted center wavelength | 628 nm | 545 nm | 470 nm |
| Transmitted color | cyan | magenta | yellow |

The lateral dimensions of a pixel and thus of the DCF may be a further parameter that influences the reflectivity and/or transmissivity characteristics of the DCF, especially when these dimensions are in the range of approximately twenty times the grating period or smaller. Of course, the pixels and DCFs need not have a square shape, as those of FIG. 1. Alternatively, they may be of rectangular, hexagonal or any other appropriate shape.

It is true that DCFs 1 as shown in FIGS. 2 and 3 have a spectral characteristic that depends on the azimuthal angle of the incident light 90. This undesired effect can be eliminated or reduced by choosing other diffractive structures than ruled gratings, e.g., circular gratings or two perpendicular ruled gratings, or by other measures.

It is also true that the transmissivity of the DCFs 1 as shown in FIGS. 2 and 3 depends on the angle of incidence $\theta_{in}$ of the incident light 90. This undesired dependence can be reduced, e.g., by depositing a high-index layer on top of the DCF.

The large number of degrees of freedom of the DCFs according to the invention opens a wide range of possibilities to design the properties of the DCFs. Consequently, many problems can be avoided, minimized or reduced by choosing an appropriate DCF design.

For the fabrication of the DCF according to the invention, only two essential steps are necessary: a replication step and a deposition step. Standard replication and evaporation processes can be used. For the replication, a specific master is needed. The master has the desired DCF pattern with the three grating periods and the profiles and depths which are necessary to obtain the specific color of the DCF. Any nano imprint process can be used for the replication process, such as nanolithography, UV casting or UV embossing. It is also possible to directly etch the grating into the semiconductor detector material by means of standard photolithography. For the deposition step, thermal evaporation and/or spin coating from the liquid phase can be used. The high-index material (waveguide material) can be deposited by an evaporation process in one step, provided that all the three DCFs need the same high-index-layer thickness. Multi-step evaporations with shadow mask are also possible, but more complicated. Depending on the materials used and the thickness required, spin coating of the materials on the wafer is also possible for the deposition of the dielectric layers.

Figure 3D:
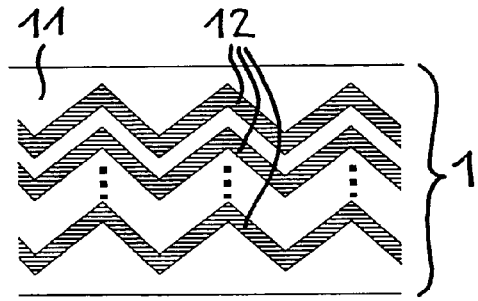

The basic production steps are described in FIG. 5. An image sensor 2 with a plurality of pixels 21, typically arranged in a one- or two-dimensional array, is provided. The low-index material 11, e.g., in the form of a sol-gel, is spread over the image sensor 2 (FIG. 5(a)). A complex grating master 3 is used to replicate the grating structure on the image sensor 2. The grating master 3 is aligned with the image sensor 2 with the aid of a microscope 5 (FIG. 5(b)); the alignment is indicated by two arrows 51, 52. By using UV embossing, only selected regions of the image sensor 2 can be covered with the grating structures. For this purpose, the master 3 additionally comprises a mask 4 with transparent areas 41 and opaque areas 42. The low-index material 11 is exposed to UV radiation 6 through the mask 4 (FIG. 5(c)). After an appropriate exposure time, the mask 4 is lifted up, and the superfluous low-index material (in this example, the shaded areas) is removed (FIG. 5(d)). Consequently, replicated grating structures 13, which may differ from each other, remain on the light-sensitive areas of the pixels 21. Once the grating is replicated, techniques such as thermal evaporation or spin coating are used to deposit the high-index material 12 on top of the grating structures 13 (FIG. 5(e)). On top of the high-index layer, low-index material and further layers can be deposited in order to obtain three-dimensional structures such as shown in FIG. 3, and/or to form multi-layered dielectric filters or waveguides. The alternate deposition of high-index material 12 and low-index material 11 can be repeated once or several times in order to obtain three-dimensional DCFs 1 as shown in FIGS. 3(b)-(d).

This invention is not limited to the preferred embodiments described above, to which variations and improvements may be made, without departing from the scope of protection of the present patent.

| LIST OF REFERENCE SIGNS | |
|---|---|
| 1 | Diffractive color filter |
| 11 | Low-index material |
| 12 | High-index material |
| 13 | Replicated grating structure |
| 2 | Image sensor |
| 21 | Pixels |
| 3 | Grating master |
| 4 | Mask |
| 41 | Transparent mask areas |
| 42 | Opaque mask areas |
| 5 | Microscope |
| 51, 52 | Alignment directions |
| 6 | UV radiation |
| 90 | Incident radiation |
| 91 | Reflected radiation |
| 92 | Transmitted radiation |

The invention claimed is:

1. A color image sensor having a top surface to receive incident light, the sensor comprising:
    a plurality of light sensing pixels; and
    a plurality of at least two different types of zero-order diffractive color filters, each filter disposed between a respective light sensing pixel and the top surface, the plurality of at least two different types of zero-order diffractive filters configured to form a color filter array over the plurality of light sensing pixels,
    wherein each type of zero-order diffractive color filter comprises:
        a low-index material having a first index of refraction; and at least one high-index material diffractive structure having a second index of refraction higher than the first index of refraction, said at least one high-index material structure embedded in said low-index material such that said at least one high-index material diffractive structure is disposed above the respective light sensing pixel and is operative to act as a waveguiding layer, and wherein said at least one high-index material diffractive structure and said low-index material form at least one diffractive structure.

2. The color image sensor according to claim 1, wherein said at least one diffractive structure has a square, rectangular, sinusoidal or triangular profile.

3. The color image sensor according to claim 1, wherein said at least one diffractive structure has a grating period between 50 nm and 1000 nm.

4. The color image sensor according to claim 1, wherein said at least one diffractive structure has a grating depth between 10 nm and 1000 nm.

5. The color image sensor according to claim 1, wherein at least one dielectric layer is arranged in at least one of the following positions: beneath; and above said at least one diffractive structure.

6. The color image sensor according to claim 1, wherein said color filters comprise at least one material selected from the group consisting of: epoxy, acrylate, polycarbonate, UV-curable sol-gel material, silicon oxide, carbide, diamond, carbon, carbon derivative, ZnO, ZnS, and titanium oxide.

7. The color image sensor according to claim 1, wherein said plurality of at least two different types of zero-order diffractive color filters are operative to act as color filters to filter light incident on said plurality of different types of zero-order diffractive color filters into one of the following two groups of colors: a first group of red, green, and blue colors; and a second group of cyan, magenta and yellow colors.

8. The color image sensor according to claim 1,
wherein said at least one diffractive structure has a grating period between 50 nm and 1000 nm; and
wherein said at least one diffractive structure has a grating depth between 10 nm and 1000 nm;
wherein at least one dielectric layer is arranged in at least one of the following positions: beneath; and above said at least one diffractive structure;
wherein said color filters comprise at least one material selected from the following group consisting of: epoxy, acrylate, polycarbonate, UV-curable sol-gel material, silicon oxide, carbide, diamond, carbon, carbon derivative, ZnO, ZnS, and titanium oxide; and
wherein said plurality of at least two different types of zero-order diffractive color filters are operative to act as color filters to filter light incident on said plurality of at least two different types of zero-order diffractive color filters into one of the following two groups of colors: a first group of red, green and blue colors; and a second group of cyan, magenta and yellow colors.

9. The color image sensor according to claim 1, wherein each at least one high-index material diffractive structure comprises a grating and each at least one diffractive structure comprises:
a plurality of gratings arranged one above the other within the low-index material to form a three-dimensional diffractive color filter.

* * * * *